US009222966B2

(12) United States Patent
Amanuma

(10) Patent No.: US 9,222,966 B2
(45) Date of Patent: Dec. 29, 2015

(54) TEST APPARATUS AND TEST METHOD

(75) Inventor: Seiji Amanuma, Saitama (JP)

(73) Assignee: ADVANTEST CORPORATION, Tokyo (JP)

( * ) Notice: Subject to any disclaimer, the term of this patent is extended or adjusted under 35 U.S.C. 154(b) by 639 days.

(21) Appl. No.: 13/215,184

(22) Filed: Aug. 22, 2011

(65) Prior Publication Data

US 2012/0217985 A1 Aug. 30, 2012

(30) Foreign Application Priority Data

Oct. 5, 2010 (JP) ................................. 2010-225733

(51) Int. Cl.
G01R 31/00 (2006.01)
G01R 31/26 (2014.01)

(52) U.S. Cl.
CPC .................................. G01R 31/2607 (2013.01)

(58) Field of Classification Search
None
See application file for complete search history.

(56) References Cited

U.S. PATENT DOCUMENTS

| 3,414,822 | A | * | 12/1968 | Davey et al. | 327/178 |
| 4,128,761 | A | * | 12/1978 | Oehler | 250/222.1 |
| 5,748,642 | A | * | 5/1998 | Lesmeister | 714/724 |
| 6,313,657 | B1 | | 11/2001 | Hashimoto | |
| 2003/0001585 | A1 | * | 1/2003 | Montrose | 324/519 |
| 2004/0004511 | A1 | * | 1/2004 | Kao | 327/536 |
| 2005/0134121 | A1 | * | 6/2005 | Lathrop et al. | 307/80 |
| 2006/0214830 | A1 | * | 9/2006 | Vaiana | 341/172 |
| 2009/0322369 | A1 | * | 12/2009 | Song et al. | 324/763 |
| 2010/0153054 | A1 | * | 6/2010 | Horiguchi | 702/120 |

FOREIGN PATENT DOCUMENTS

| JP | H03-189575 A | 8/1991 |
| JP | 2000-241503 A | 9/2000 |
| JP | 2004-518194 A | 6/2004 |

OTHER PUBLICATIONS

Office Action for Japanese Patent Application No. 2010-225733, issued by the Japanese Patent Office on Dec. 17, 2013.
Office Action for Taiwanese Patent Application No. 100135317, issued by the Taiwan Patent Office on Jul. 24, 2014.
Office Action for Chinese Patent Application No. 201110302261.5, issued by the Chinese Patent Office on Jul. 16, 2014.

* cited by examiner

Primary Examiner — Melissa Koval
Assistant Examiner — Courtney McDonnough

(57) ABSTRACT

There is provided a test apparatus that is capable of applying, to a device under test, a current that rises within a short period. A test apparatus for testing a device under test, includes a current source that supplies the device under test with a current, a dummy load that has an electrical characteristic corresponding to an electrical characteristic of the device under test, and a switching section that switches whether the current source is connected to the dummy load or the device under test. Here, after connecting the current source to the dummy load, the switching section disconnects the current source from the dummy load and connects the current source to the device under test when a voltage applied to the dummy load reaches a voltage within a predetermined range.

12 Claims, 12 Drawing Sheets

TEST APPARATUS AND TEST METHOD

BACKGROUND

1. Technical Field

The present invention relates to a test apparatus and a test method.

2. Related Art

To test electrical characteristics of a semiconductor device, such as an insulated gate bipolar transistor (IGBT), a metal-oxide semiconductor field effect transistor (MOSFET), and a diode, by applying a current to the semiconductor device, the current is conventionally applied to the semiconductor device while the device under test is connected to a high-speed current source as disclosed in, for example, Japanese Patent Application Publication No. 2000-241503.

It, however, becomes more difficult to implement a high-speed current source as the value of the current increases. A conventional test apparatus uses a special power source that can respond at high speed and apply a large current, but such a special power source is expensive.

In addition, even such a special power source requires a certain period of time until the current reaches a sufficient test current level. Some currents may flow into the device under test before the current of the current source reaches a sufficient test current level, resulting in raising the temperature of the device under test. If the temperature of the device under test exceeds a test condition, the reliability of the measured values may be compromised. Thus, it is required to realize a low-cost test apparatus that can response at higher speed and can apply a large current to a device under test.

SUMMARY

Therefore, it is an object of an aspect of the innovations herein to provide a test apparatus and test method, which are capable of overcoming the above drawbacks accompanying the related art. That is, a first embodiment of the innovations herein may include a test apparatus for testing a device under test, including a current source that supplies the device under test with a current, a dummy load that has an electrical characteristic corresponding to an electrical characteristic of the device under test, and a switching section that switches whether the current source is connected to the dummy load or the device under test. Here, after connecting the current source to the dummy load, the switching section disconnects the current source from the dummy load and connects the current source to the device under test when a voltage applied to the dummy load reaches a voltage within a predetermined range.

For example, the switching section disconnects the current source from the dummy load after having connected the current source to the device under test. After a predetermined time elapses since the current source starts outputting a voltage, the switching section may disconnect the current source from the dummy load and connect the current source to the device under test. The dummy load may include a resistance corresponding to a resistance of the device under test.

The test apparatus may further include a voltage measuring section that measures the voltage input into the dummy load. The voltage measuring section may measure the voltage applied to the dummy load at intervals of a predetermined measuring time, and when the voltage applied to the dummy load, which is measured by the voltage measuring section, changes at a rate lower than a predetermined rate, the switching section may disconnect the current source from the dummy load and connect the current source to the device under test.

The test apparatus may further include a storage section that stores therein, in association with each other, (i) elapsed time information indicative of a pre-measured elapsed time since the current source starts outputting a voltage while being connected to the dummy load and (ii) output value information indicative of a pre-measured output current of the current source corresponding to the elapsed time, and a control section that reads from the storage section elapsed time information associated with output value information indicative of an output current corresponding to the voltage within the predetermined range, and, when the elapsed time indicated by the read elapsed time information elapses, controls the switching section to disconnect the current source from the dummy load and to connect the current source to the device under test.

The test apparatus may include a plurality of the current sources. Here, the switching section may switch whether each of the current sources is connected to the dummy load or the device under test, and after connecting a given one of the current sources to the dummy load depending on a current that is expected to be applied to the device under test, disconnect the given current source from the dummy load and connect the given current source to the device under test when the voltage applied to the dummy load reaches a voltage within a predetermined range.

After connecting two or more selected ones of the current sources to the dummy load, the switching section may disconnect the two or more selected current sources from the dummy load and connect the two or more selected current sources to the device under test when the voltage applied to the dummy load reaches a voltage within a predetermined range.

The test apparatus may include a plurality of the dummy loads in a one-to-one-correspondence with the plurality of current sources. Here, the switching section may include a plurality of switches in a one-to-one correspondence with the plurality of current sources, and each switch may switch whether a corresponding one of the current sources is connected to a corresponding one of the dummy loads or the device under test.

For example, after a predetermined time elapses since a first current source of the current sources is connected to the device under test, the switching section connects a second current source of the current sources to the device under test and disconnects the first current source from the device under test. When a voltage between the second current source and a dummy load corresponding to the second current source reaches a predetermined voltage, the switching section may connect the second current source to the device under test and disconnect the first current source from the device under test.

The test apparatus may further include a storage section that stores therein, for each of the current sources, (i) elapsed time information indicative of a pre-measured elapsed time since the current source starts outputting a voltage while being connected to a corresponding one of the dummy loads and (ii) output value information indicative of an output current of the current source corresponding to the elapsed time, in association with each other, and a control section that controls the switches. Here, the control section may obtain a rising change rate of a current expected to be applied to the device under test, obtain from the storage section the elapsed time information and the output value information associated with each of the current sources, and switch whether the switches are connected to the dummy loads or the device under test based on the obtained rising change rate, the obtained elapsed time information, and the obtained output value information. For example, the first current source outputs a smaller current than the second current source does.

A second embodiment of the innovations herein may include a test method for testing a device under test, including supplying a current from a current source to a dummy load that has an electrical characteristic corresponding to an electrical characteristic of the device under test, when a voltage applied to the dummy load from the current source reaches a voltage within a predetermined range, disconnecting the current source from the dummy load and connecting the current source to the device under test.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
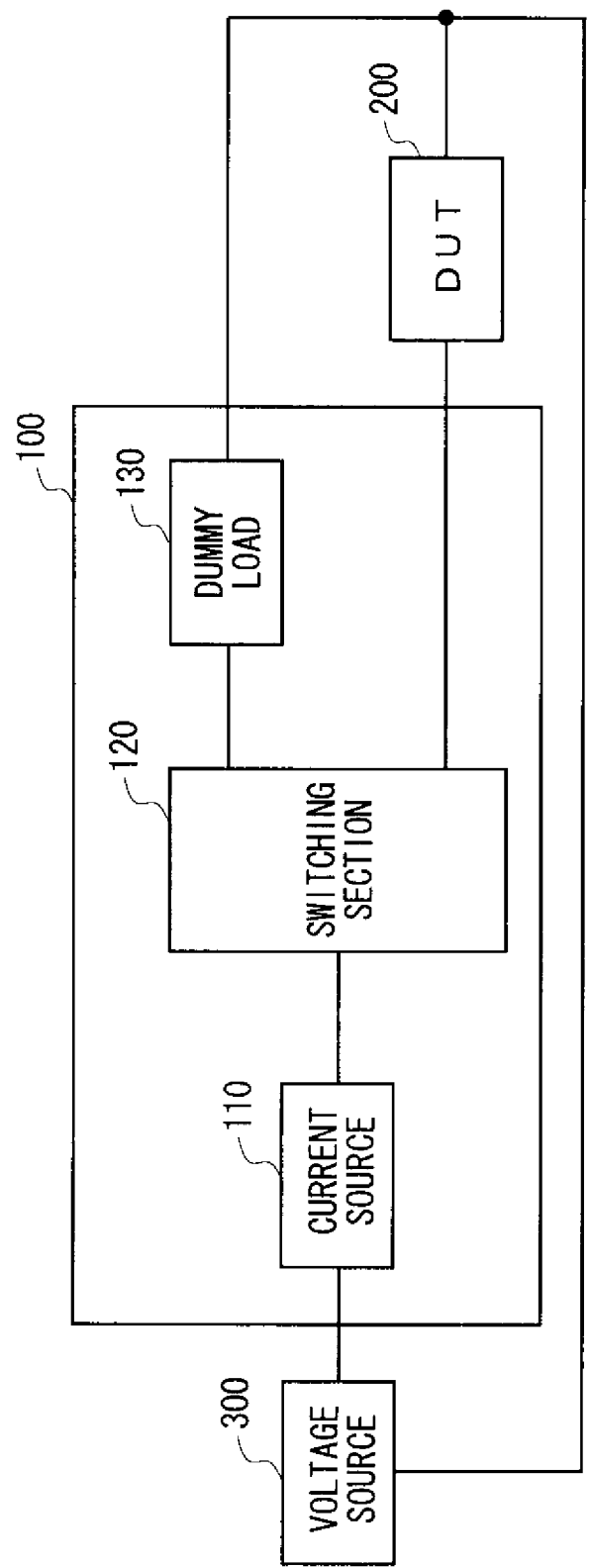
FIG. 1 illustrates the configuration of a test apparatus 100 relating to an embodiment of the present invention.

FIG. 1 illustrates the configuration of a test apparatus 100 relating to an embodiment of the present invention. The test apparatus 100 is designed to test the electrical characteristics of a device under test 200. The device under test 200 is, for example, an IGBT, a MOSFET, and a diode. The test apparatus 100 includes a current source 110, a switching section 120, and a dummy load 130. The current source 110 receives power from an external voltage source 300, for example. The test apparatus 100 may alternatively include the voltage source 300 therein.

The current source 110 receives power from the voltage source 300 and supplies a constant current to the dummy load 130 or the device under test 200. When the impedance of the dummy load 130 or the device under test 200 changes, the current source 110 keeps outputting a constant current by changing the output voltage. The current source 110 includes, for example, a bipolar transistor or a MOSFET. The current source 110 may include an operational amplifier and a power transistor connected to the output stage of the operational amplifier.

The switching section 120 switches whether the current source 110 is connected to the dummy load 130 or the device under test 200. For example, the switching section 120 has a switch to connect the current source 110 to one of the dummy load 130 and the device under test 200. The switching section 120 may alternatively include a first switch that switches whether or not the current source 110 is connected to the dummy load 130, and a second switch that switches whether or not the current source 110 is connected to the device under test 200. The switching section 120 may include any type of switch such as a semiconductor switch and a mechanical switch.

The switching section 120 may include a plurality of types of switches and may select a switch to establish connection with the dummy load 130 and the device under test 200 depending on the electrical characteristics of the dummy load 130 and the device under test 200. For example, when the current flowing through the switching section 120 is smaller than a predetermined current value and the switching section 120 needs to complete the switching operation within a predetermined period of time, the switching section 120 selects a MOSFET as a semiconductor switch. On the other hand, when the current flowing through the switching section 120 is larger than the predetermined current value and the switching section 120 does not need to complete the switching within the predetermined period of time, the switching section 120 may select an IGBT or a thyristor as a semiconductor switch.

The dummy load 130 has electrical characteristics corresponding to the electrical characteristics of the device under test 200. For example, the dummy load 130 has a resistance corresponding to the resistance of the device under test 200. The dummy load 130 may have a resistance substantially equal to the on-resistance of the device under test 200. Specifically speaking, the resistance of the dummy load 130 is no less than 50% and no more than 150% of the on-resistance of the device under test 200. More preferably, the resistance of the dummy load 130 is no less than 90% and no more than 110% of the on-resistance of the device under test 200.

The dummy load 130 may have substantially the same input impedance as the device under test 200. The dummy load 130 may have other electrical characteristics than the input resistance or the input impedance in common with the device under test 200. For example, the dummy load 130 is the same type of device as the device under test 200. Specifically speaking, when the device under test 200 is an IGBT, the dummy load 130 may be an IGBT having the same on-resistance, constant current, withstand voltage, and input impedance as the device under test 200. The dummy load 130 may be an electronic load. The electronic load may have a regeneration capability. Furthermore, the power generated through the regeneration capability may be used to power the voltage source 300.

After connecting the current source 110 to the dummy load 130, the switching section 120 disconnects the current source 110 from the dummy load 130 and connects the current source 110 to the device under test 200 when the voltage applied to the dummy load 130 reaches a voltage within a predetermined range. The switching section 120 may simultaneously perform the disconnection of the current source 110 from the dummy load 130 and the connection of the current source 110 to the device under test 200. For example, the switching section 120 keeps the current source 110 connected to the dummy load 130 during the initial state of the test apparatus 100, during which the test apparatus 100 may be powered on. Once the test apparatus 100 is powered on, the current source 110 is supplied with power and the output voltage of the current source 110 starts rising.

After connecting the current source 110 to the dummy load 130, the switching section 120 may disconnect the current source 110 from the dummy load 130 and connect the current source 110 to the device under test 200 when the output voltage of the current source 110 stays in a predetermined range of voltages over a predetermined period of time or longer. For example, the switching section 120 disconnects the current source 110 from the dummy load 130 and connects the current source 110 to the device under test 200 when the output voltage stays in a range of voltages corresponding to a range of currents allowed to be applied to the device under test 200, over a period of time equal to or longer than the period of the AC signal component superimposed on the output current of the current source 110.

The test apparatus 100 may switch whether the current source 110 is connected to the dummy load 130 or the device under test 200 in response to a trigger signal, received at the switching section 120, that switches whether the current source 110 is connected to the dummy load 130 or the device under test 200. The test apparatus 100 may obtain the trigger signal from outside.

For example, the switching section 120 connects the current source 110 to the dummy load 130 when the voltage of the trigger signal is no less than a threshold voltage and connects the current source 110 to the device under test 200 when the voltage of the trigger signal is less than the threshold voltage. The switching section 120 may switch whether the current source 110 is connected to the dummy load 130 or the device under test 200 every time it receives a pulse-like trigger signal. Specifically speaking, the test apparatus 100 can apply a current pulse having a desired width to the device under test 200 by switching whether the current source 110 is connected to the dummy load 130 or the device under test 200 in the following manner.

To begin with, the voltage source 300 is activated while being connected to the test apparatus 100 (step 1). The test apparatus 100 waits until the voltage supplied from the voltage source 300 to the current source 110 becomes stable (step 2). Subsequently, the test apparatus 100 controls the switching section 120 in synchronization with a first trigger signal obtained from outside to connect the current source 110 to the dummy load 130 (step 3).

After this, the test apparatus 100 waits until the output voltage of the current source 110 becomes stable (step 4). The test apparatus 100 waits for, for example, approximately 1 μs to 10 μs. After the output voltage of the current source 110 becomes stable, the test apparatus 100 controls the switching section 120 in synchronization with a second trigger signal obtained from outside to disconnect the current source 110 from the dummy load 130 and connect the current source 110 to the device under test 200 (step 5). Subsequently, the test apparatus 100 controls the switching section 120 in synchronization with a third trigger signal obtained from outside to disconnect the current source 110 from the device under test 200 and connect the current source 110 to the dummy load 130 (step 6).

In the above-described manner, the test apparatus 100 can apply to the device under test 200 a current pulse having a width corresponding to the difference between the timing at which the second trigger signal is obtained and the timing at which the third trigger signal is obtained. When the voltage source 300 has already been activated, the test apparatus 100 may perform the step 4 after the step 6. The test apparatus 100 can successively apply current pulses to the device under test 200 by repeatedly performing the steps 4, 5 and 6. The waiting time in the step 4 is sufficiently shorter than the width of the current pulse expected to be supplied to the device under test 200. Thus, the test apparatus 100 can apply to the device under test 200 a current pulse with a substantially any width.

Having the above-described configuration, the test apparatus 100 can apply to the device under test 200 a test current that immediately rises, even when the current source 110 requires a long period of time until becoming ready to output the test current. Therefore, the test apparatus 100 can test the electrical characteristics of the device under test 200 observed in response to application of a current, without increasing the temperature of the device under test 200. The test apparatus 100 does not require a special voltage source 300 and can use a low-cost power source for the voltage source 300.

Figure 2:
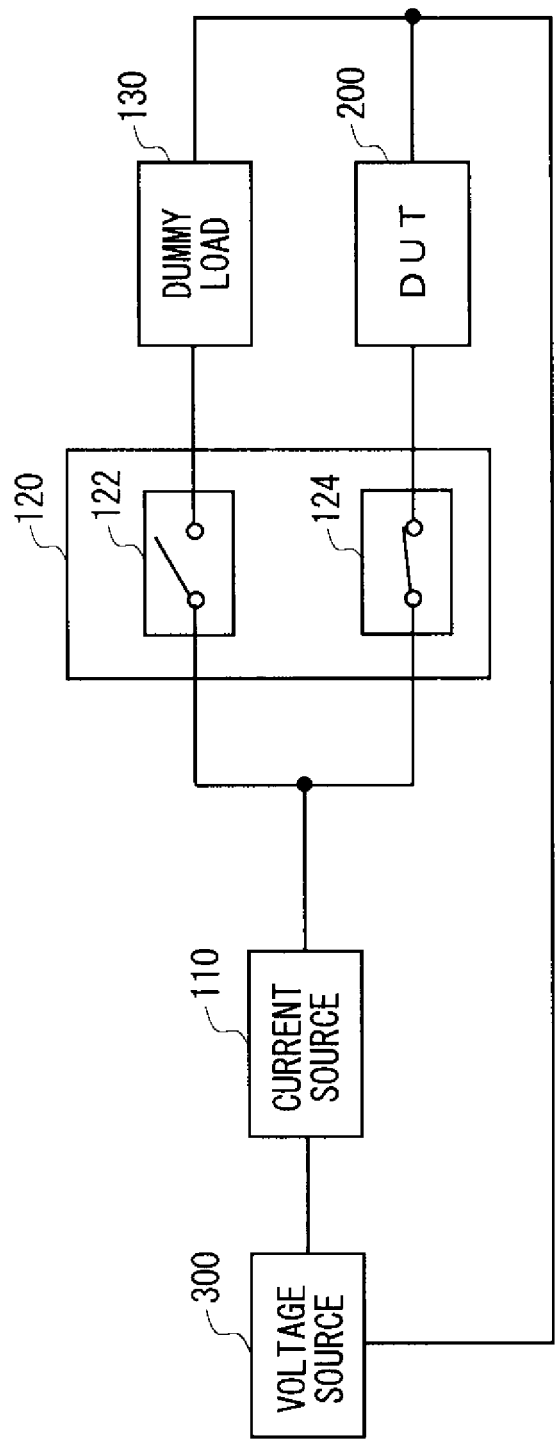
FIG. 2 illustrates another exemplary configuration of the test apparatus 100 relating to the embodiment of the present invention.

FIG. 2 illustrates another exemplary configuration of the test apparatus 100 relating to the embodiment of the present invention. FIG. 2 shows the device under test 200 and the voltage source 300 that are connected to the test apparatus 100. The switching section 120 shown in FIG. 2 includes a switch 122 and a switch 124. The switch 122 switches whether or not the current source 110 is connected to the dummy load 130. The switch 124 switches whether or not the current source 110 is connected to the device under test 200.

In this way, the switching section 120 can disconnect the current source 110 from the dummy load 130 after having connected the current source 110 to the device under test 200. When the switching section 120 disconnects the current source 110 from the dummy load 130 after having connected the current source 110 to the device under test 200, a surge can be suppressed since the impedance variation is only small while the current source 110 is disconnected from the dummy load 130 and connected to the device under test 200.

Specifically speaking, the switching section 120 turns on the switch 124 to connect the current source 110 to the device under test 200 while keeping the switch 122 turned on to connect the current source 110 to the dummy load 130. After this, the switching section 120 turns off the switch 122 to disconnect the current source 110 from the dummy load 130. Here, "to turn on a switch" means that electricity is allowed to flow between the terminals of the switch and "to turn off a switch" means that electricity is stopped between the terminals of the switch.

After a predetermined time has elapsed since the current source 110 starts outputting a voltage, the switching section 120 may disconnect the current source 110 from the dummy load 130 and connect the current source 110 to the device under test 200. Specifically speaking, the switching section 120 may disconnect the current source 110 from the dummy load 130 and connect the current source 110 to the device under test 200 when the output voltage of the current source 110, which is connected the dummy load 130, reaches a voltage within a range of voltages expected to be applied to the device under test 200.

The switching section 120 may disconnect the current source 110 from the dummy load 130 and connect the current source 110 to the device under test 200 when a sufficiently longer time than the time required by the switching section 120 to complete the switching operation has elapsed after the current source 110 starts outputting a voltage. For example, the switching section 120 can connect the current source 110 to the device under test 200 after the current source 110 starts outputting a voltage, the switching section 120 connects the current source 110 to the dummy load 130, a period of time 100 to 1000 times as long as the period of time required by the switching section 120 to complete the switching operation elapses, and the output current of the current source 110 becomes stable.

The switching section 120 may connect the current source 110 to the dummy load 130 after a predetermined first time has elapsed since the current source 110 starts outputting a voltage, and disconnect the current source 110 from the dummy load 130 and connect the current source 110 to the device under test 200 after a second time has elapsed. For example, the switching section 120 connects the current source 110 to the dummy load 130 after the output voltage of the current source 110 reaches a voltage within a range of voltages expected to be applied to the device under test 200.

The switching section 120 may disconnect the current source 110 from the dummy load 130 and connect the current source 110 to the device under test 200 when the output voltage of the current source 110 falls within the range of voltages expected to be applied to the device under test 200 after the elapse of the transient response time of the surge voltage resulting from the connection of the current source 110 to the dummy load 130. Having the above-described configuration, the test apparatus 100 can connect the current source 110 to the device under test 200 after the output current of the current source 110 becomes stable.

Figure 3A:
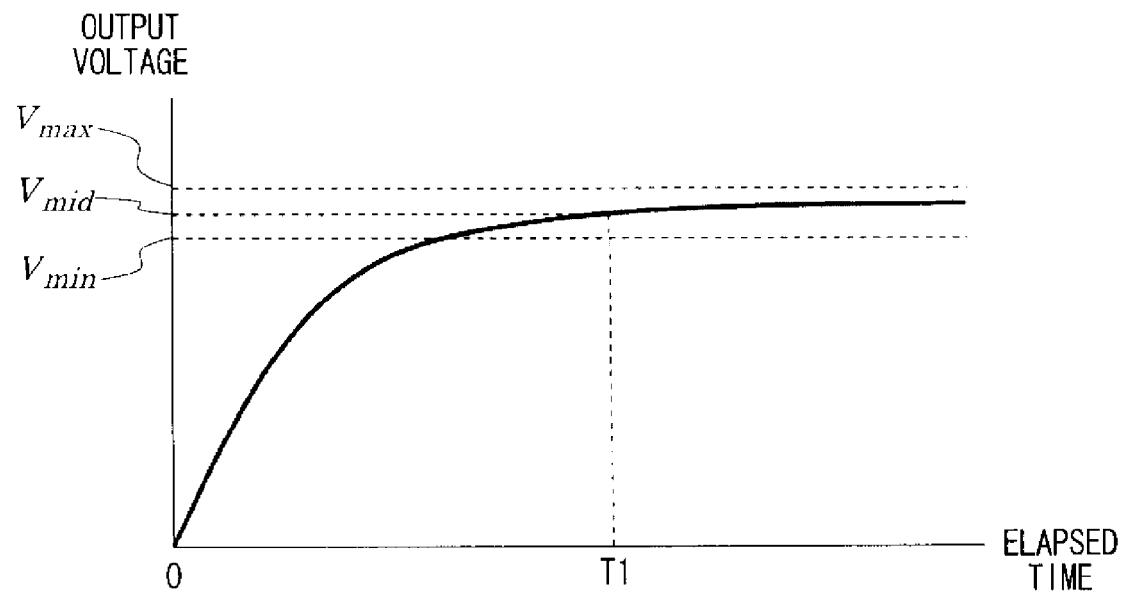
FIG. 3A illustrates the output voltage of a current source 110 as a function of the elapsed time after the current source 110 starts outputting a voltage.

FIG. 3A illustrates the output voltage of the current source 110 as a function of the elapsed time since the current source 110 starts outputting a voltage. The voltage output from the current source 110 starts increasing once the current source 110 starts receiving power from, for example, the voltage source 300. For example, when the output resistance of the current source 110 is sufficiently smaller than the resistance of the dummy load 130, $V=I \times R$ holds true where V denotes the voltage output from the current source 110, I denotes the current output from the current source 110, and R denotes the resistance of the dummy load 130. Accordingly, once the voltage output from the current source 110 becomes constant, the current source 110 is considered to be outputting a constant current.

When the value of the current used to test the device under test 200 is defined to fall within a range of no less than $I_{min}$ and no more than $I_{max}$, the switching section 120 may connect the current source 110 to the device under test 200 when the voltage output from the current source 110 falls within the range of no less than $V_{min}=I_{min} \times R$ and no more than $V_{max}=I_{max} \times R$. The switching section 120 may connect the current source 110 to the device under test 200 and disconnect the current source 110 from the dummy load 130 when a time T1 has elapsed that is required to increase the voltage output from the current source 110 up to an intermediate voltage $V_{mid}$ between and $V_{min}$ and $V_{max}$.

Figure 3B:
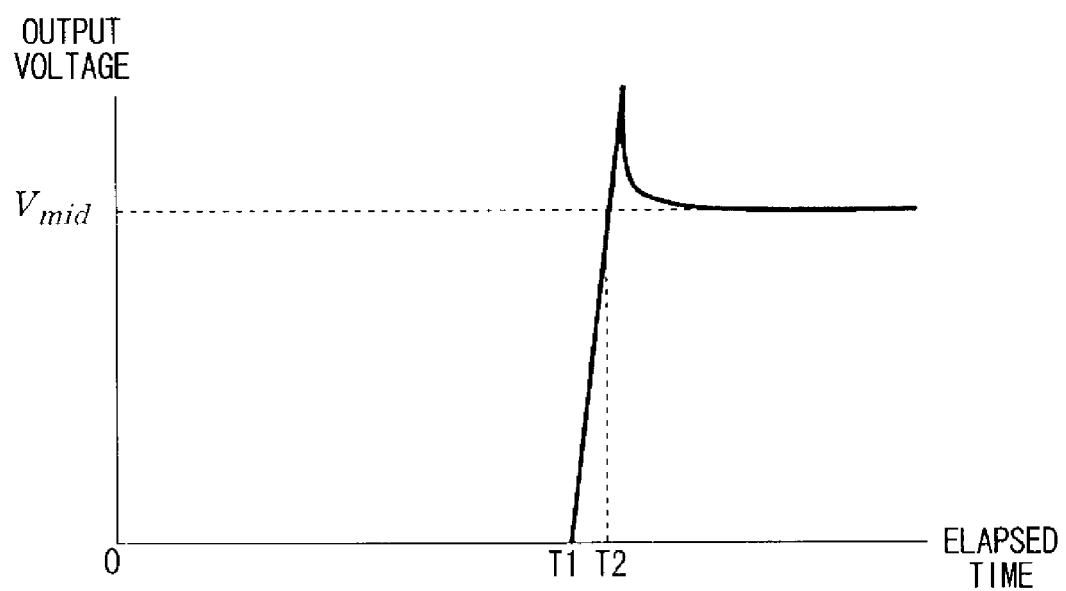
FIG. 3B illustrates the voltage input into a device under test 200 as a function of the elapsed time after the current source 110 starts outputting a voltage.

FIG. 3B illustrates the voltage input to the device under test 200 as a function of the elapsed time since the current source 110 starts outputting a voltage. After the switching section 120 disconnects the current source 110 from the dummy load 130 and connects the current source 110 to the device under test 200, the voltage input into the device under test 200 suddenly increases and reaches V.sub.mid when a time T2 has elapsed. The time (T2−T1), which is required to increase the input voltage up to V.sub.mid after the current source 110 is connected to the device under test 200, is shorter than the time T1 that is required to increase the output voltage up to V.sub..mid after the current source 110 starts outputting a voltage. Here, the time (T2−T1) includes the response time of the switching section 120. For example, the time (T2−T1) is no less than 1/10000th and no more than 1/1000th of the time T1.

At the instant at which the switching section 120 connects the current source 110 to the device under test 200, a surge voltage may occur due to the change in the impedance of the load connected to the current source 110 as shown in FIG. 3B. The test apparatus 100 may include a surge absorber to absorb a surge between the switching section 120 and the device under test 200.

Figure 4A:
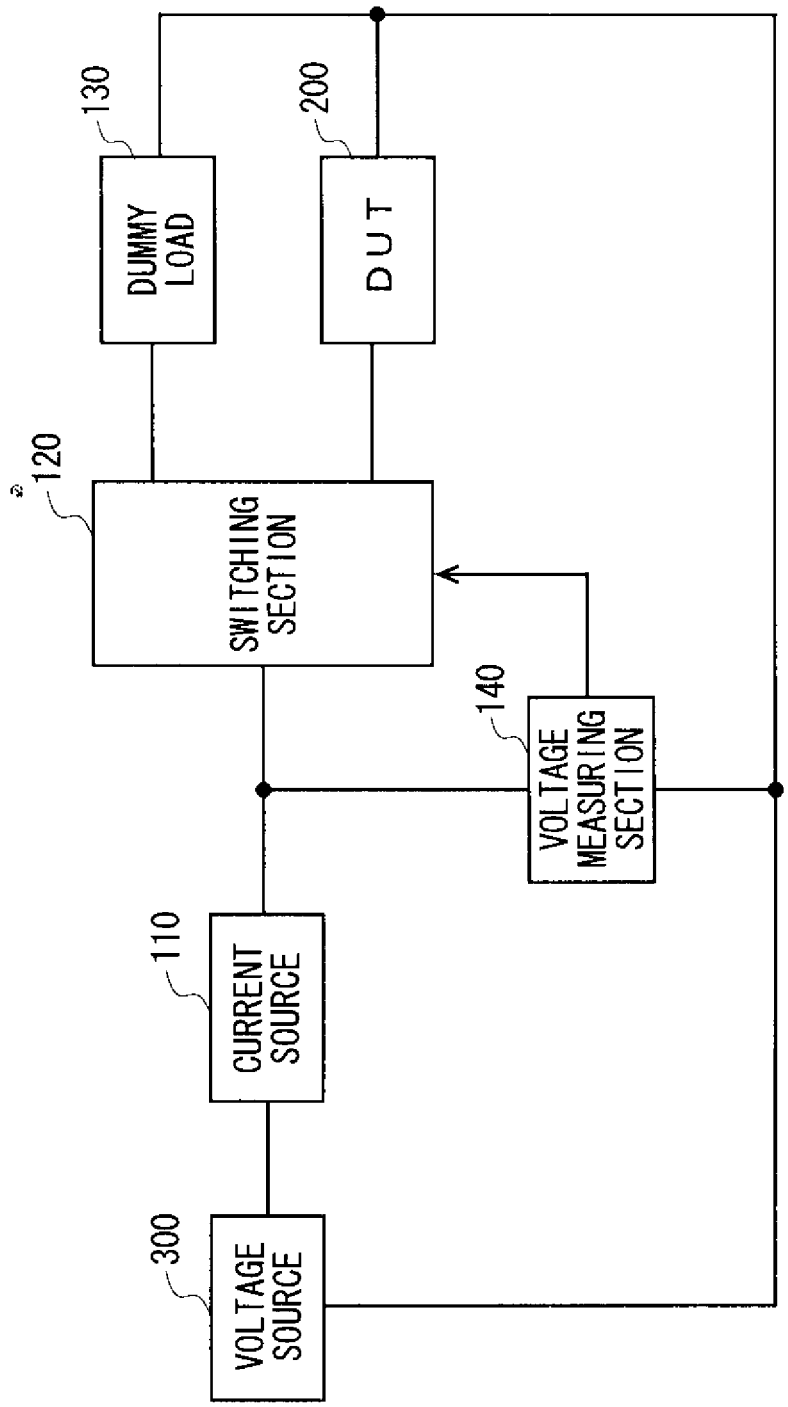
FIG. 4A illustrates the configuration of the test apparatus 100 relating to another embodiment.

FIG. 4A illustrates the configuration of the test apparatus 100 relating to another embodiment. FIG. 4A also shows the device under test 200 and the voltage source 300 connected to the test apparatus 100. The test apparatus 100 shown in FIG. 4A additionally includes a voltage measuring section 140, when compared with the test apparatus 100 shown in FIG. 1. The voltage measuring section 140 measures the voltage input into the dummy load 130. The voltage measuring section 140 measures the voltage input into the dummy load 130 by measuring the output voltage of the current source 110 between the current source 110 and the switching section 120.

Figure 4B:
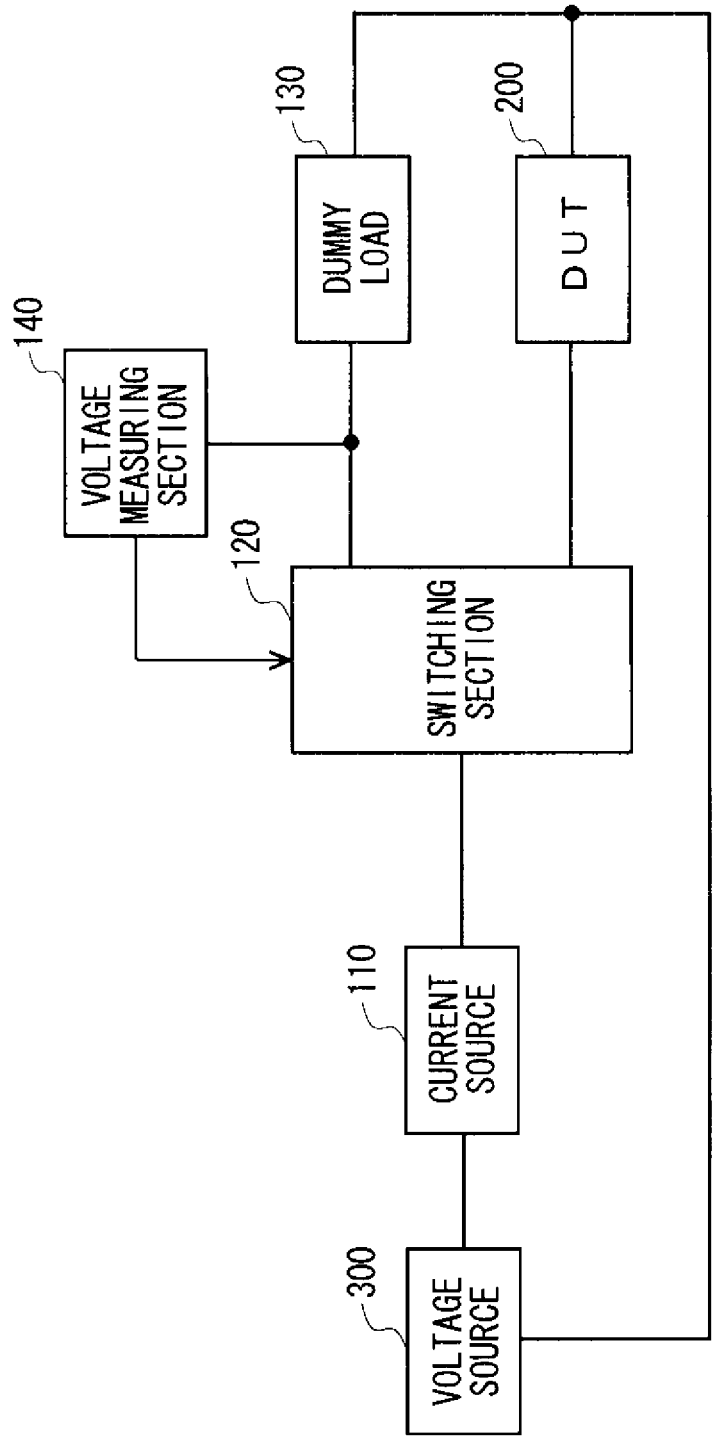
FIG. 4B illustrates the configuration of the test apparatus 100 relating to another embodiment.

FIG. 4B illustrates the configuration of the test apparatus 100 relating to another embodiment. FIG. 4B also shows the device under test 200 and the voltage source 300 connected to the test apparatus 100. The test apparatus 100 shown in FIG. 4B has the voltage measuring section 140 positioned between the switching section 120 and the dummy load 130, different from the test apparatus 100 shown in FIG. 4A.

The voltage measuring section 140 measures the voltage applied to the dummy load 130, for example, at intervals of a predetermined measuring time. The voltage measuring section 140 may select how frequently the voltage applied to the dummy load 130 is measured, based on the tolerance of the test current for the device under test 200 and the rate of the change in the voltage output from the current source 110. For example, the voltage measuring section 140 measures the voltage applied to the dummy load 130 at intervals sufficiently shorter than the time that is required to change the voltage applied to the dummy load 130 by an amount corresponding to the tolerance of the applied current.

The switching section 120 may disconnect the current source 110 from the dummy load 130 and connect the current source 110 to the device under test 200 when the rate of the change in the voltage applied to the dummy load 130, which is measured by the voltage measuring section 140, is lower than a predetermined rate. If the rate of the change in the voltage applied to the dummy load 130 is low, it is considered that the voltage output from the current source 110 is approaching a target value. Thus, the switching section 120 may disconnect the current source 110 from the dummy load 130 and connect the current source 110 to the device under test 200 when the values of the voltage applied to the dummy load 130, which are successively measured by the voltage measuring section 140, fall within a range of voltages necessary to test the device under test 200.

Figure 5:
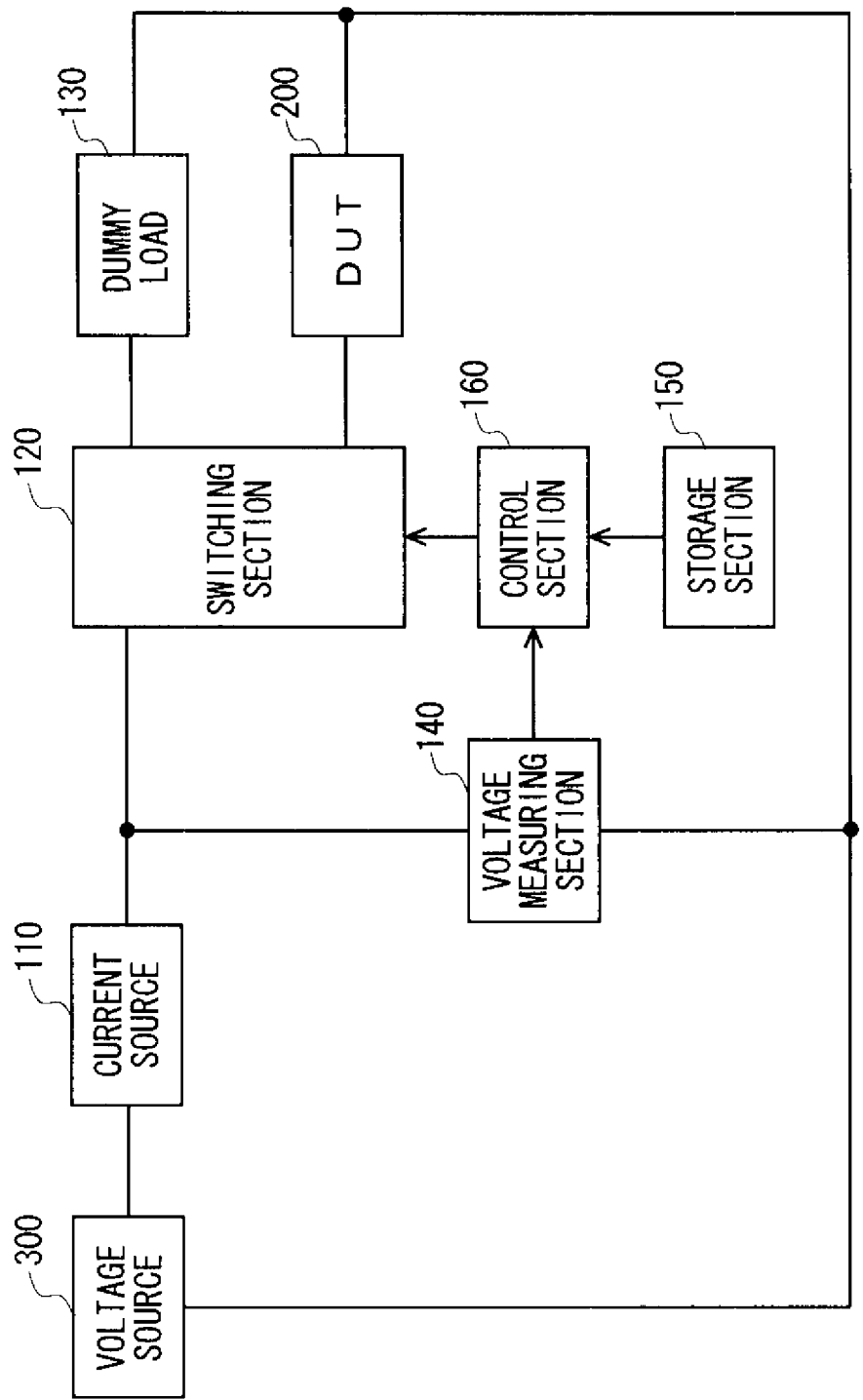
FIG. 5 illustrates the configuration of the test apparatus 100 relating to another embodiment.

FIG. 5 illustrates the configuration of the test apparatus 100 relating to another embodiment. FIG. 5 also shows the device under test 200 and the voltage source 300 connected to the test apparatus 100. The test apparatus 100 shown in FIG. 5 additionally includes a storage section 150 and a control section 160, when compared with the test apparatus 100 shown in FIG. 4A.

The storage section 150 stores therein, in association with each other, (i) elapsed time information indicative of a pre-measured elapsed time after the current source 110 starts outputting a voltage while connected to the dummy load 130 and (ii) output value information indicative of a pre-measured output current of the current source 110 corresponding to the elapsed time. For example, the storage section 150 stores therein output value information indicative of the value of the voltage output from the current source 110 to the dummy load 130, which is measured at intervals of a predetermined time k since the current source 110 starts outputting the voltage, in association with the elapsed time after the current source 110 starts outputting the voltage. The storage section 150 may store therein, as the output value information, the value of the current output from the current source 110 to the dummy load 130.

Specifically speaking, the storage section 150 stores therein the output voltage value of the current source 110, which is measured when a time represented by k×n (n is a natural number) has elapsed, in association with the value of k×n, which is an example of the elapsed time information. The storage section 150 is, for example, a non-volatile memory. For example, the storage section 150 is a non-volatile memory in to which the elapsed time information and the output value information have been written prior to the fabrication of the test apparatus 100.

The storage section 150 may store therein output voltage values that are measured at intervals determined according to the rate of the change in the voltage output from the current source 110. For example, when the rate of the change in the voltage output from the current source 110 is relatively high, the storage section 150 stores therein output voltage values that are measured at shorter intervals, compared with when the rate of the change in the voltage output from the current source 110 is relatively low.

The control section 160 obtains from the storage section 150 elapsed time information associated with output value information indicative of a voltage within a predetermined range. The control section 160 controls the switching section 120 to disconnect the current source 110 from the dummy load 130 and to connect the current source 110 to the device under test 200 when the elapsed time indicated by the read elapsed time information has elapsed. For example, the control section 160 obtains from the storage section 150 the elapsed time that can cause the current source 110 to output a voltage corresponding to the current to be applied to the device under test 200. The control section 160 controls the switching section 120 to disconnect the current source 110 from the dummy load 130 and connects the current source 110 to the device under test 200 when the obtained elapsed time has elapsed after the current source 110 starts outputting the voltage.

Figure 6:
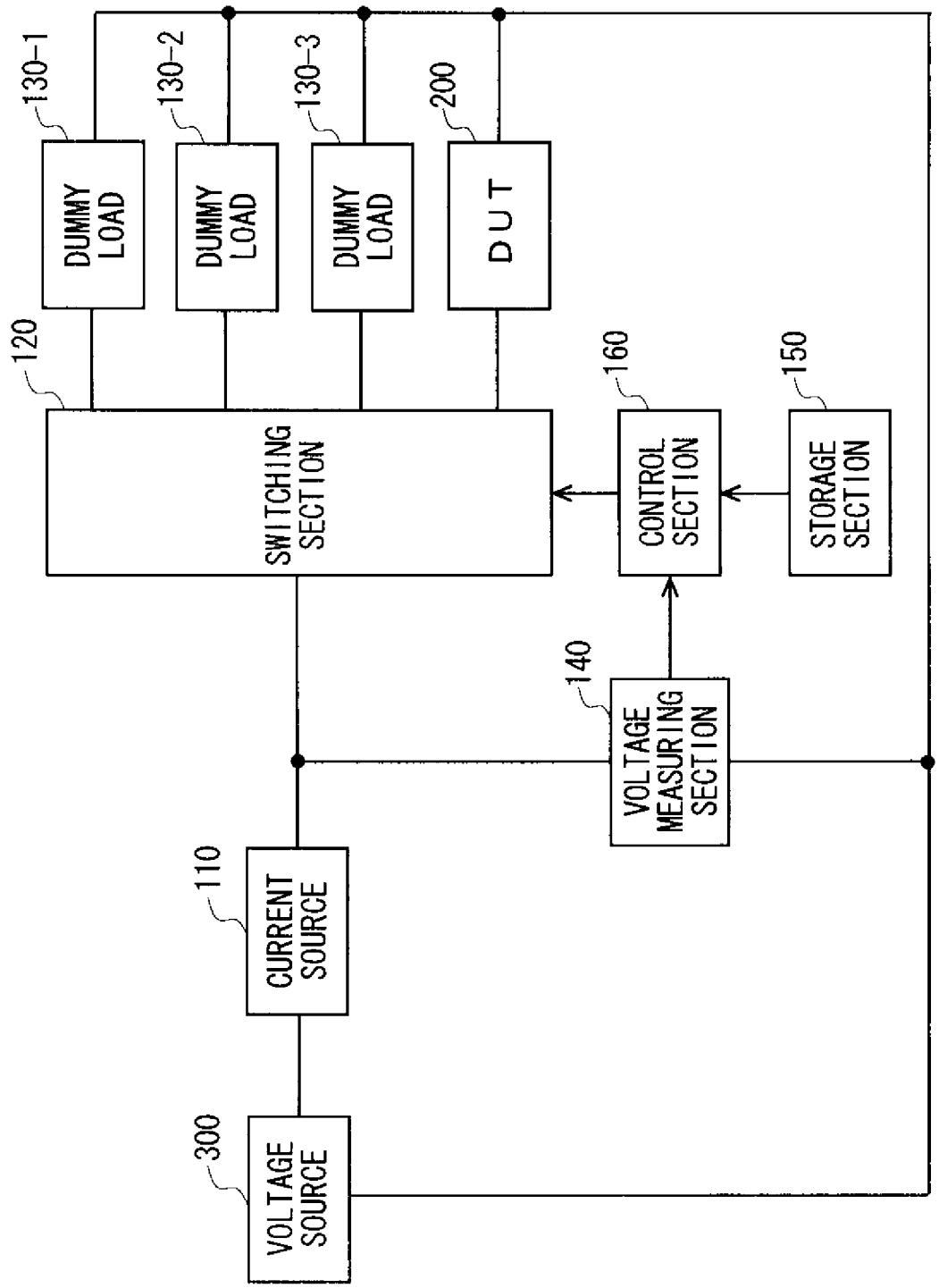
FIG. 6 illustrates the configuration of the test apparatus 100 relating to another embodiment.

FIG. 6 illustrates the configuration of the test apparatus 100 relating to another embodiment. FIG. 6 also shows the device under test 200 and the voltage source 300 connected to the test apparatus 100. The test apparatus 100 shown in FIG. 6 is different from the test apparatus 100 shown in FIG. 5 in that a plurality of dummy loads 130 (130-1, 130-2 and 130-3) are provided. The dummy loads 130 individually have different resistances. The dummy loads 130 may be individually different types of devices.

The switching section 120 may select one of the dummy loads 130 to which the current source 110 is connected depending on the type or electrical characteristics of the device under test 200. For example, the switching section 120 connects the current source 110 to one of the dummy loads 130 that has substantially the same resistance as the device under test 200.

The storage section 150 may store therein, for each of the dummy loads 130, (i) elapsed time information indicative of the elapsed time after the current source 110 starts outputting the voltage and (ii) output value information indicative of the current output from the current source 110 to the dummy load 130 at the timing when the elapsed time has elapsed, in association with each other. The control section 160 may obtain from the storage section 150 elapsed time information and output value information associated with any of the dummy loads 130, and control the switching section 120 based on the obtained information.

Figure 7:
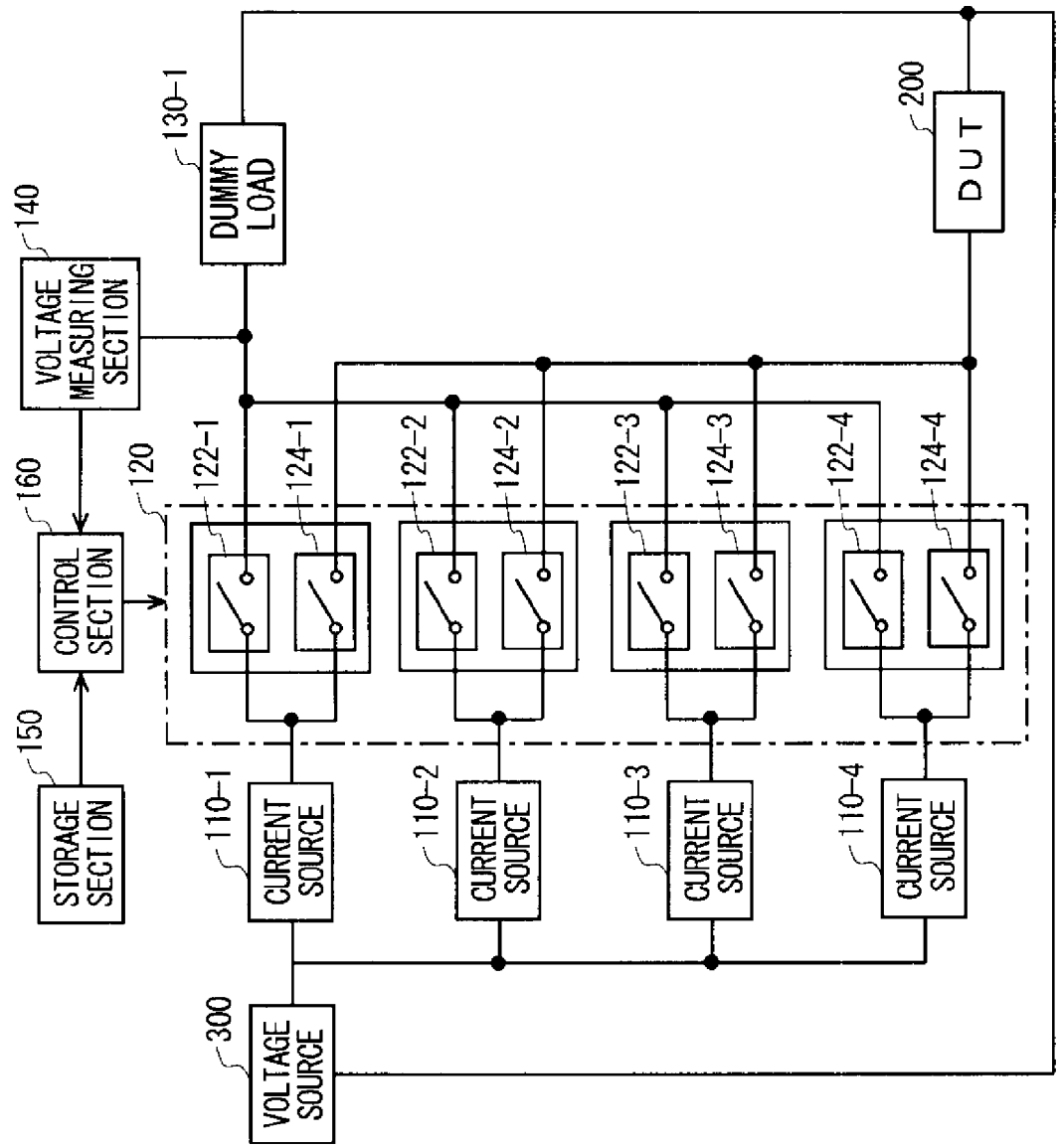
FIG. 7 illustrates the configuration of the test apparatus 100 relating to another embodiment.

FIG. 7 illustrates the configuration of the test apparatus 100 relating to another embodiment. FIG. 7 also shows the device under test 200 and the voltage source 300 connected to the test apparatus 100. The test apparatus 100 shown in FIG. 7 is different from the test apparatus 100 shown in FIG. 5 in that a plurality of current sources 110-$m$ (m=1, 2, 3 or 4) and a plurality of switching sections 120-$m$ are provided in a one-to-one correspondence with each other. Each of the switching sections 120-$m$ has a switch 122-$m$ and a switch 124-$m$. The current sources 110-$m$ may output the same current or different currents.

The input stage of each current source 110-$m$ is connected to the voltage source 300. The output stage of each current source 110-$m$ is connected to a corresponding switch 122-$m$ and a corresponding switch 124-$m$. The terminal of each switch 122-$m$ that is not connected to a corresponding current source 110-$m$ is connected to the dummy load 130. The terminal of each switch 124-$m$ that is not connected to a corresponding current source 110-$m$ is connected to the device under test 200.

The switching section 120 switches whether each of the current sources 110-$m$ is connected to the dummy load 130 or the device under test 200. The switching section 120 connects one of the current sources 110-$m$ to the dummy load 130, depending on the current to be applied to the device under test 200. For example, it is assumed that the current sources 110-1, 110-2, 110-3 and 110-4 respectively output 100 A, 200 A, 300 A and 400 A. When the device under test 200 should be supplied with a current of 200 A, the switching section 120 connects the current source 110-2 to the dummy load 130.

When the voltage applied to the dummy load 130 reaches a voltage within a predetermined range, the switching section 120 disconnects the current source 110-2 from the dummy load 130 and connects the current source 110-2 to the device under test 200. Specifically speaking, when the voltage applied to the dummy load 130 reaches a voltage corresponding to the current expected to be applied to the device under test 200, the switching section 120 connects the current source 110-2 to the device under test 200.

The switching section 120 may connect two or more selected one of the current sources 110 to the dummy load 130. When the voltage applied to the dummy load 130 reaches a voltage within a predetermined range, the switching section 120 may disconnect the two or more selected current sources 110 from the dummy load 130 and connect the two or more selected current sources 110 to the device under test 200.

For example, when the device under test 200 should be supplied with a current of 600 A, none of the current sources 110-1 to 110-4 can by itself output a current necessary to test the device under test 200. Thus, the switching section 120 may first connect the current sources 110-2 and 110-4 to the dummy load 130 and then connect the current sources 110-2 and 110-4 to the device under test 200.

Figure 8:
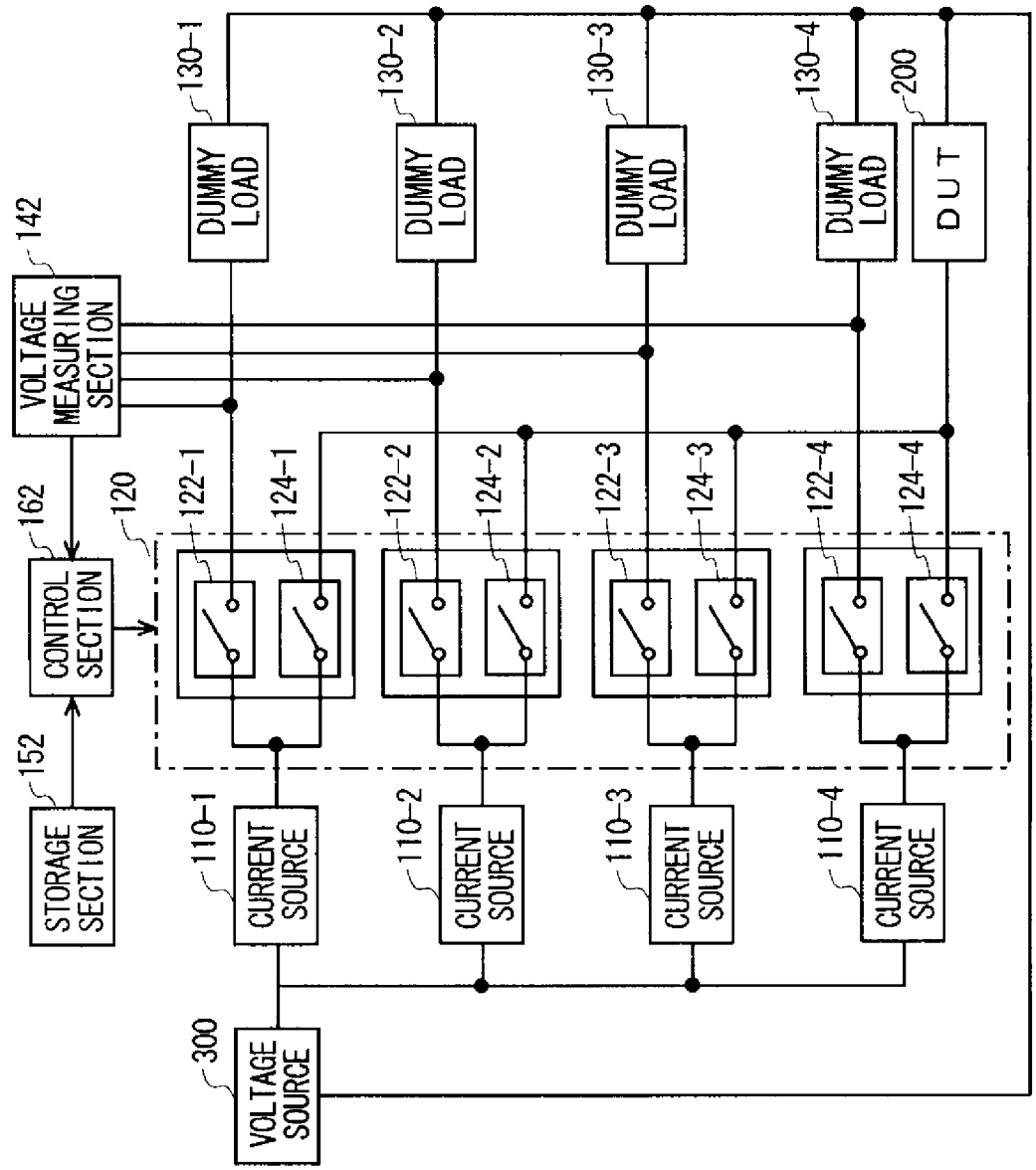
FIG. 8 illustrates the configuration of the test apparatus 100 relating to another embodiment.

FIG. 8 illustrates the configuration of the test apparatus 100 relating to another embodiment. FIG. 8 also shows the device under test 200 and the voltage source 300 connected to the test apparatus 100. The test apparatus 100 shown in FIG. 8 is different from the test apparatus 100 shown in FIG. 7 in that a plurality of dummy loads 130-*m* are provided in a one-to-one correspondence with the current sources 110-*m*. Furthermore, the test apparatus 100 includes a voltage measuring section 142, a storage section 152 and a control section 162.

The switching section 120 includes a plurality of switches 122-*m* and a plurality of switches 124-*m* corresponding to the current sources 110. The switching section 120 switches whether each of the current sources 110 is connected to a corresponding one of the dummy loads 130-1 to 130-4 or to the device under test 200. Specifically speaking, the switch 122-*m* switches whether or not the current source 110-*m* is connected to the dummy load 130-*m*. The switch 124-*m* switches whether or not the current source 110-*m* is connected to the device under test 200.

The test apparatus 100 controls the order of opening and closing the switches 122-*m* and the switches 124-*m* to vary the rising change rate (slew rate) of the current applied to the device under test 200. Here, the rising change rate denotes the increase in current per unit time.

The switching section 120 first turns on all of the switches 122-*m* to connect the current sources 110-*m* to the dummy loads 130-*m*. After this, the switching section 120 turns on the switch 124-1 to connect the first current source 110-1 of the current sources 110 to the device under test 200. Subsequently, after a predetermined time has elapsed, the switching section 120 turns on the switch 124-2 to connect the second current source 110-2 to the device under test 200 and turns off the switch 124-1 to disconnect the first current source 110-1 from the device under test 200.

When the voltage between the second current source 110-2 and the corresponding dummy load 130-2 reaches a predetermined voltage, the switching section 120 may connect the second current source 110-2 to the device under test 200 and disconnect the first current source 110-1 from the device under test 200.

The switching section 120 may determine when to connect the current source 110-2 to the device under test 200, based on the rising change rate of the current expected to be applied to the device under test 200. For example, it is assumed that the output current of the current source 110 is required to rise to 100 A within 50 µs from when the current source 110 starts outputting the voltage and then to 200 A within 100 µs. In this case, the switching section 120 connects the current source 110-2, which outputs 100 A, to the test apparatus 100 when 50 µs has elapsed, and connects the current source 110-3, which outputs 200 A, to the test apparatus 100 after another 50 µs has elapsed.

The control section 162 may control the switches 122-*m* and the switches 124-*m*. The storage section 152 may store therein, for each of the current sources 110, (i) elapsed time information indicative of the pre-measured elapsed time that has elapsed after the current source 110 starts outputting the voltage while being connected to the corresponding dummy load 130 and (ii) output value information indicative of the pre-measured output current of the current source 110 at the timing when the elapsed time has elapsed. The control section 160 may obtain the rising change rate of the current expected to be applied to the device under test 200, obtain from the storage section 150 the elapsed time information and the output value information associated with each of the current sources 110, and switch whether the switches are turned on/off based on the obtained rising change rate, elapsed time information, and output value information.

For example, the storage section 152 stores therein, for the current source 110-1, output value information indicative of 50 A, 120 A, and 150 A in association with elapsed time information indicative of 50 µs, 100 µs, and 150 µs. The storage section 152 stores therein, for the current source 110-2, output value information indicative of 100 A, 250 A, and 300 A in association with elapsed time information indicative of 50 µs, 100 µs, and 150 µs. The storage section 152 stores therein, for the current source 110-3, output value information indicative of 150 A, 200 A, and 300 A in association with elapsed time information indicative of 50 µs, 100 µs, and 150 µs.

It is assumed that the control section 162 obtains from outside a rising change rate according to which the output current of the current source 110 rises to 100 A within 50 µs after the current source 110 starts outputting the voltage and to 200 A within 100 µs. In this case, the control section 162 reads the combinations of the elapsed time information and the output value information from the storage section 152, selects the current source 110-2 that is associated with a combination of elapsed time information indicative of 50 µs and output value information indicative of 100 A, and connects the current source 110-2 to the device under test 200 when 50 µs has elapsed after the current source 110 starts outputting the voltage. Furthermore, the control section 162 reads the combinations of the elapsed time information and the output value information from the storage section 152, selects the current source 110-3 that is associated with a combination of elapsed time information indicative of 100 µs and output value information indicative of 200 A, and connects the current source 110-3 to the device under test 200 when 100 µs has elapsed.

Figure 9A:
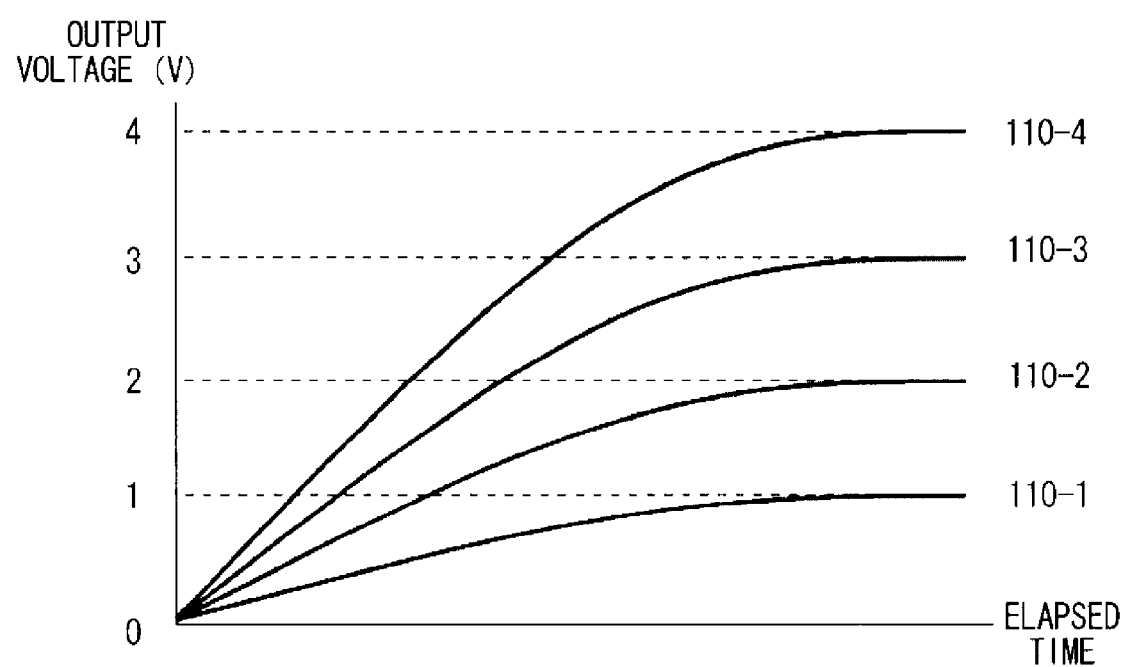
FIG. 9A illustrates the output voltage value as a function of the elapsed time after current sources 110-1 to 110-4 start outputting currents.

FIG. 9A illustrates the output voltage value as a function of the elapsed time after the current sources 110-1 to 110-4 start outputting currents. The voltages of the current sources 110-1, 110-2, 110-3, and 110-4 rise after they start outputting the voltage and reach the voltages determined by their respective output currents and the on-resistance of the device under test 200.

For example, when the output currents of the current sources 110-1, 110-2, 110-3, and 110-4 are respectively 100 A, 200 A, 300 A, and 400 A and the on-resistance of the device under test 200 is mΩ, the voltages output from the current sources 110-1, 110-2, 110-3, and 110-4 respectively reach 1 V, 2 V, 3 V, and 4V.

Figure 9B:
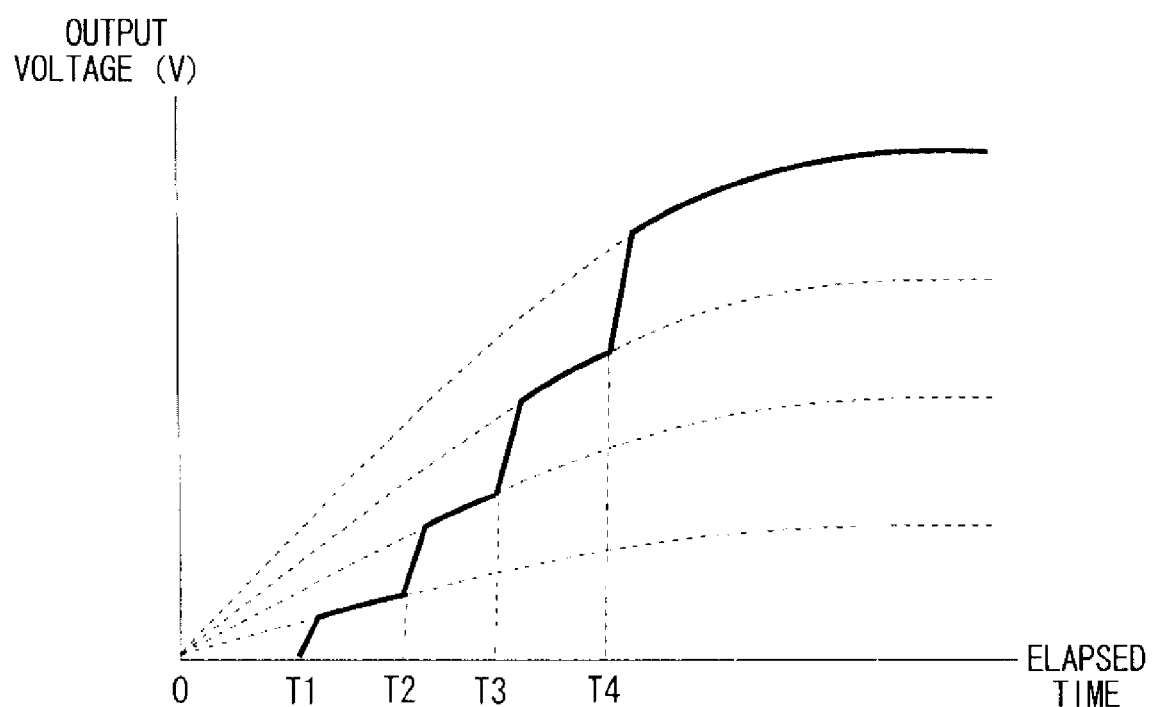
FIG. 9B illustrates how the voltage applied to the device under test 200 varies when a current source 110-$m$ connected to the device under test 200 is switched.

FIG. 9B illustrates the voltage applied to the device under test 200 when the current source 110-*m* connected to the device under test 200 is switched among the current sources 110-1 to 110-4. The switching section 120 switches the current source 110-*m* connected to the device under test 200 among the current sources 110-1 to 110-4 when the elapsed times T1, T2, T3 and T4 have elapsed after the current sources 110 start outputting the voltages.

In the example shown in FIG. 9B, the current sources 110-1 to 110-4 start outputting the voltages while being connected to the dummy loads 130-1 to 130-4. The switches 122-1, 122-2, 122-3 and 122-4 are kept turned on. On the other hand, the switches 124-1, 124-2, 124-3 and 124-4 are kept turned off.

The switching section 120 disconnects the current source 110-1 from the dummy load 130-1 and connects the current source 110-1 to the device under test 200 when the elapsed time T1 has elapsed. Specifically speaking, the switching section 120 turns on the switch 124-1 and turns off the switch 122-1. When the elapsed time T2 has elapsed, the switching section 120 connects the current source 110-2 to the device under test 200 and disconnects the current source 110-1 from the device under test 200. In addition, the switching section 120 disconnects the current source 110-2 from the dummy load 130-2. Specifically speaking, the switching section 120 turns on the switch 124-2 and turns off the switches 124-1 and 122-2.

In the same manner, the switching section 120 turns on the switch 124-3 and turns off the switches 124-2 and 122-3 when the elapsed time T3 has elapsed. The switching section 120 turns on the switch 124-4 and turns off the switches 124-3 and 122-4 when the elapsed time T4 has elapsed. The switching section 120 turns on and off the switches 122-$m$ and 124-$m$ in the above-described order. In this way, the test apparatus 100 can increase the voltage applied to the device under test 200 in the manner indicated by the bold line in FIG. 9B.

Figure 9C:
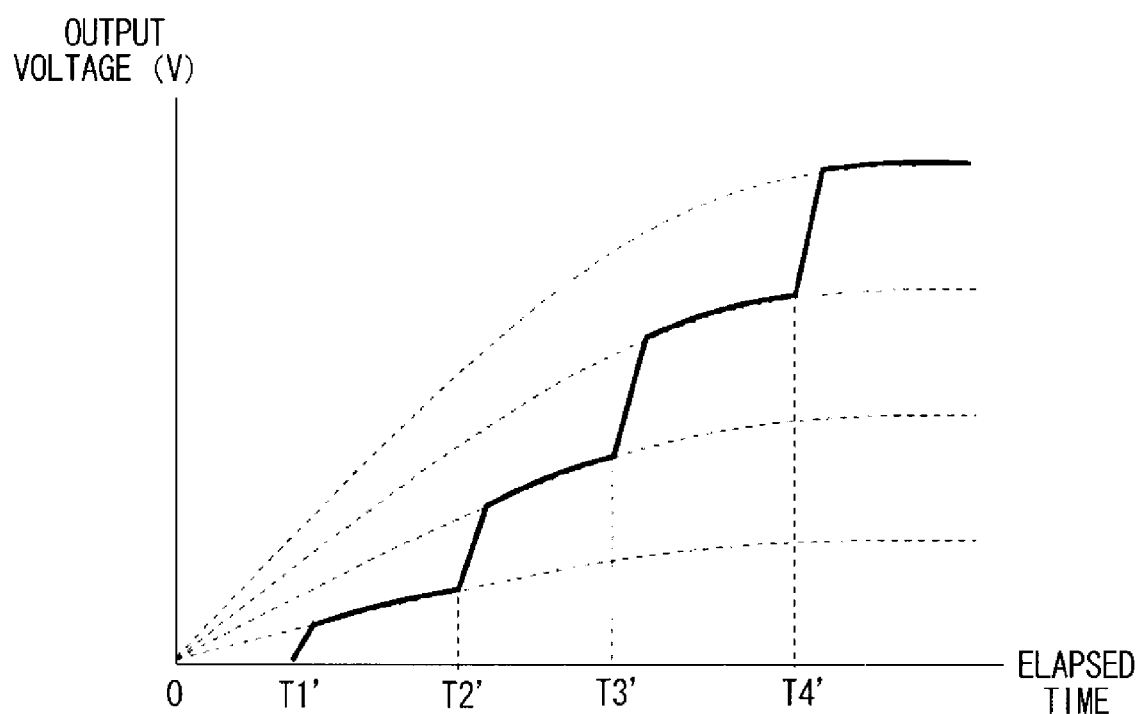
FIG. 9C illustrates how the voltage applied to the device under test 200 varies when the current source 110-$m$ connected to the device under test 200 is switched.

FIG. 9C illustrates the voltage applied to the device under test 200 when the current source 110-$m$ connected to the device under test 200 is switched among the current sources 110-1 to 110-4. In FIG. 9C, the switching section 120 turns on/off the switches 122-$m$ and 124-$m$ when elapsed times T1', T2', T3' and T4' have elapsed, which are different from the elapsed times shown in FIG. 9B. The test apparatus 100 may determine when to control the switching section 120 based on the rising change rate of the current expected to be input into the device under test 200.

The test apparatus 100 can output a current having an expected rising change rate by controlling the timings of turning on/off the switches. For example, since the elapsed times T1', T2', T3', and T4' shown in FIG. 9C are respectively longer than the elapsed times T1, T2, T3 and T4 shown in FIG. 9B, the voltage applied to the device under test 200 increases more moderately in the example shown in FIG. 9C than in the example shown in FIG. 9B.

As is apparent from the above, the test apparatus 100 relating to every embodiment of the present invention can be realized at low cost but still apply a large and high-speed-response current to the device under test 200. The test apparatus 100 can be easily maintained since it does not require a special voltage source. When used to test the device under test 200, the test apparatus 100 can obtain the characteristics of the device under test 200 without the influence of its temperature characteristics and provide highly accurate measurement.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

What is claimed is:

1. A test apparatus for testing a device under test, comprising:
   a plurality of current sources that supply the device under test with current;
   a dummy load that has an electrical characteristic corresponding to an electrical characteristic of the device under test; and
   a switching section that switches whether each of the current sources is connected to the dummy load or the device under test, wherein,
   after connecting two or more selected ones of the current sources to the dummy load depending on a current that is expected to be applied to the device under test, the switching section disconnects the two or more selected current sources from the dummy load and connects the two or more selected current sources to the device under test when the voltage applied to the dummy load reaches a voltage within a predetermined range, and
   the switching section disconnects the two or more selected current sources from the dummy load after having connected the two or more selected current sources to the device under test.

2. The test apparatus as set forth in claim 1, wherein
   the dummy load includes a resistance corresponding to a resistance of the device under test.

3. The test apparatus as set forth in claim 1, further comprising
   a voltage measuring section that measures the voltage input into the dummy load.

4. The test apparatus as set forth in claim 3, wherein
   the voltage measuring section measures the voltage applied to the dummy load at intervals of a predetermined measuring time, and
   when the voltage applied to the dummy load, which is measured by the voltage measuring section, changes at a rate lower than a predetermined rate, the switching section disconnects the current source from the dummy load and connects the current source to the device under test.

5. The test apparatus as set forth in claim 1, further comprising:
   a storage section that stores therein, in association with each other, (i) elapsed time information indicative of a pre-measured elapsed time since the current source starts outputting a voltage while being connected to the dummy load and (ii) output value information indicative of a pre-measured output current of the current source corresponding to the elapsed time; and
   a control section that reads from the storage section elapsed time information associated with output value information indicative of an output current corresponding to the voltage within the predetermined range, and, when the elapsed time indicated by the read elapsed time information elapses, controls the switching section to disconnect the current source from the dummy load and to connect the current source to the device under test.

6. The test apparatus as set forth in claim 1, wherein
   the current sources output different currents from each other.

7. The test apparatus as set forth in claim 1, comprising
   a plurality of the dummy loads in a one-to-one-correspondence with the plurality of current sources, wherein
   the switching section includes a plurality of switches in a one-to-one correspondence with the plurality of current sources, and each switch switches whether a corresponding one of the current sources is connected to a corresponding one of the dummy loads or the device under test.

8. The test apparatus as set forth in claim 7, wherein after a predetermined time elapses since a first current source of the current sources is connected to the device under test, the switching section connects a second current source of the current sources to the device under test and disconnects the first current source from the device under test.

9. The test apparatus as set forth in claim 8, wherein when a voltage between the second current source and a dummy load corresponding to the second current source reaches a predetermined voltage, the switching section connects the second current source to the device under test and disconnects the first current source from the device under test.

10. The test apparatus as set forth in claim 8, wherein the first current source outputs a smaller current than the second current source does.

11. A test apparatus for testing a device under test, comprising:
    a plurality of current sources that supply the device under test with current;
    a plurality of dummy loads, in a one-to-one correspondence with the plurality of current sources, that each have an electrical characteristic corresponding to an electrical characteristic of the device under test;
    a switching section including a plurality of switches in one-to-one correspondence with the plurality of current sources, each of the switches operable to switch whether a corresponding one of the current sources is connected to a corresponding one of the dummy loads or the device under test;
    a storage section that stores therein, for each of the current sources, (i) elapsed time information indicative of a pre-measured elapsed time since the current source starts outputting a voltage while being connected to a corresponding one of the dummy loads and (ii) output value information indicative of an output current of the current source corresponding to the elapsed time, in association with each other; and
    a control section that controls the switches, wherein the control section obtains a rising change rate of a current expected to be applied to the device under test, obtains from the storage section the elapsed time information and the output value information associated with each of the current sources, and switches whether the switches are connected to the dummy loads or the device under test based on the obtained rising change rate, the obtained elapsed time information, and the obtained output value information,
    after a predetermined time elapses since a first current source of the current sources is connected to the device under test, the switching section disconnects a second current source of the current sources from a corresponding one of the dummy loads, connects the second current source to the device under test, and disconnects the first current source from the device under test, and
    the switching section disconnects the second current source from the corresponding one of the dummy loads after having connected the second current source to the device under test.

12. A test method for testing a device under test, comprising:
    depending on a current that is expected to be applied to the device under test, supplying a current from two or more selected ones of a plurality of current sources to a dummy load that has an electrical characteristic corresponding to an electrical characteristic of the device under test; and,
    when the voltage applied to the dummy load reaches a voltage within a predetermined range, connecting the two or more selected current sources to the device under test and thereafter disconnecting the two or more selected current sources from the dummy load.

* * * * *